United States Patent [19]

Herron et al.

[11] 4,234,367
[45] Nov. 18, 1980

[54] METHOD OF MAKING MULTILAYERED GLASS-CERAMIC STRUCTURES HAVING AN INTERNAL DISTRIBUTION OF COPPER-BASED CONDUCTORS

[75] Inventors: Lester W. Herron, Hopewell Junction; Raj N. Master; Rao R. Tummala, both of Wappingers Falls, all of N.Y.

[73] Assignee: International Business Machines Corporation, Armonk, N.Y.

[21] Appl. No.: 23,112

[22] Filed: Mar. 23, 1979

[51] Int. Cl.³ .................... B32B 31/24; C03B 32/00; C04B 39/00
[52] U.S. Cl. ........................... 156/89; 264/58; 264/61; 264/62; 264/65; 264/66; 427/96
[58] Field of Search ............... 156/89; 29/624, 625, 29/627, 631; 427/96, 97, 350, 377; 264/56, 58, 60, 61, 62, 64, 65, 66, 241; 174/68.5; 361/397, 411

[56] References Cited

U.S. PATENT DOCUMENTS

| | | | |
|---|---|---|---|
| 3,423,517 | 1/1969 | Arrhenius | 174/68.5 |
| 3,637,435 | 1/1972 | Schwyn | 264/62 |
| 3,770,529 | 11/1973 | Anderson | 156/89 |

Primary Examiner—Caleb Weston
Attorney, Agent, or Firm—Henry Powers

[57] ABSTRACT

The formation of sintered glass-ceramic substrates containing multi-level, interconnected thick-film circuit patterns of copper-based conductors obtained by firing in a controlled ambient of hydrogen and $H_2O$ at temperatures below the melting point of copper.

16 Claims, 4 Drawing Figures

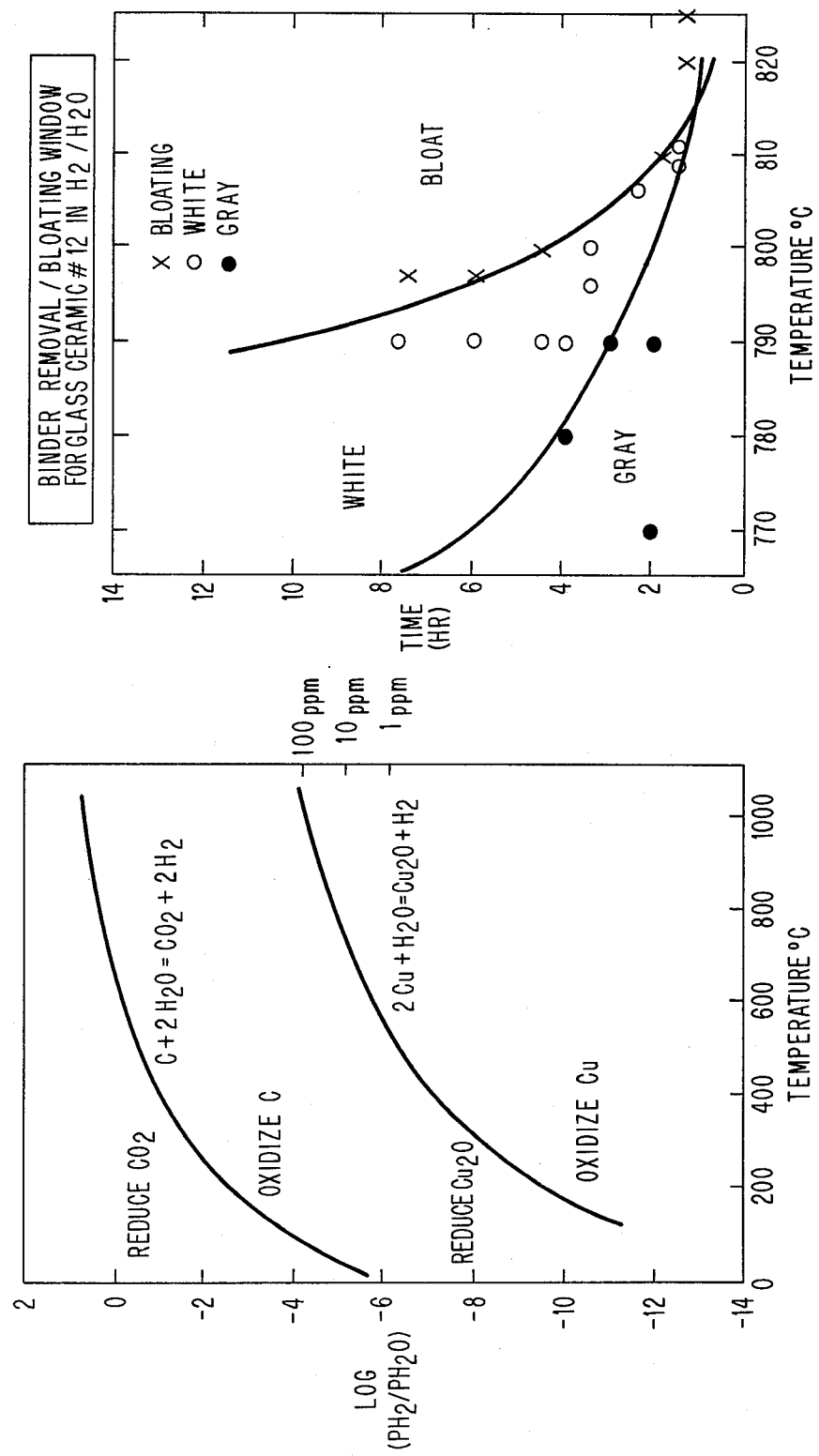

METHOD OF MAKING MULTILAYERED GLASS-CERAMIC STRUCTURES HAVING AN INTERNAL DISTRIBUTION OF COPPER-BASED CONDUCTORS

DESCRIPTION

1. Technical Field

This invention relates to the fabrication of glass-ceramic substrate carriers for mounting of semiconductor or integrated circuit chips and, more particularly to thick film inter-connected multilayer substrates comprised of sintered glass-ceramic insulators and a copper-based conductor pattern. Also this invention relates to the process and materials for producing such substrates starting with certain powders of crystallizable glass and conductor inks "or pastes", containing a finely divided powder of copper, by the so-called "laminated green sheet" technique, at firing temperatures below the melting point of copper. The substrates may be designed with termination pads for attaching semiconductor chips, connector leads, capacitors, resistors, covers, etc. Interconnection between buried conductor levels can be achieved through the so-called "vias" formed by metal paste filled holes in the individual glass-ceramic layers formed prior to lamination which upon sintering will become a sintered dense metal interconnection of copper.

One object of this invention is the fabrication of multilayered glass-ceramic substrates which are compatible with thick film circuitry of copper-based conductors and co-fireable therewith.

Another object of this invention is to provide a method for fabricating multilayer substrates of glass-ceramic containing an internal pattern of copper-based conductors.

Another object of this invention is the fabrication of multilayered glass-ceramic substrate carriers for semiconductor component chips, in which copper-based conductors, for attachment of chips, are provided at various levels within the substrate carrier.

2. Background Art

In view of the high packing densities attainable with multilevel ceramic circuit structure, they have achieved extensive acceptance in the electronics industry for packaging of semiconductor integrated devices, and other elements, as for example see U.S. Pat. No. 3,379,943 granted Apr. 23, 1968 to J. G. Breedlove, U.S. Pat. No. 3,502,520 granted Mar. 24, 1970 to B. Schwartz and U.S. Pat. No. 4,080,414 granted Mar. 21, 1978 to L. C. Anderson et al.

In general, such conventional ceramic structures are formed from ceramic green sheets which are prepared from ceramic "paints" by mixing a ceramic particulate, a thermoplastic polymer (e.g. polyvinylbutyral) and solvents. This "paint" is then cast or spread into ceramic sheets or slips from which the solvents are subsequently volatilized to provide a coherent and self-supporting flexible green sheet, which may be finally fired to drive off the resin and sinter the ceramic particulates together into a densified ceramic substrate.

In the fabrication of multilevel structures, an electrical conductor forming composition is deposited (by spraying, dipping, screening, etc.) in patterns on required green sheets which form component layers of the desired multilevel structure. The component sheets may have via or feedthrough holes punched in them, as required for level interconnection in the ultimate structure. The required number of component green sheets are stacked or superimposed to register on each other in the required order. The stack of green sheets is then compressed or compacted at necessary temperatures and pressures to effect a bond between adjacent layers not separated by the electrical conductor forming pattern. Thereafter, the green sheet laminate is fired to drive off the binders and to sinter the ceramic and metal particulates together into a ceramic dielectric structure having the desired pattern of electrical conductors extending internally therein.

Alumina ($Al_2O_3$), because of its excellent insulating properties, thermal conductivity, stability and strength has received wide acceptance as the material of choice for fabrication of such substrates. However, for various high performance applications, the relatively high dielectric constant of alumina ($\sim 10$) entails significant signal propagation delays and noise. A further disadvantage of alumina is its relatively high thermal expansion coefficient ($\sim 65$–$70 \times 10^{-7}/°$ C.) compared to that of silicon semiconductor chips ($\sim 25$–$30 \times 10^{-7}/°$ C.) which may, in certain cases, result in some design and reliability concerns, particularly where a silicon chip is joined to the substrate with solder interconnections.

A particular disadvantage is the high sintering and maturing temperature of commercial alumina ($\sim 1600°$ C.), which restricts the choice of cosinterable conducting metallurgies to refractory metals such as tungsten, molybdenum, platinum, palladium, or combination of these with each other or with certain other metals, which precludes the sole use of good electrical conductors such as gold, silver, or copper because the latter will be molten before the sintering temperature of alumina is reached.

A multi-layer glass-ceramic structure is disclosed in copending application Ser. No. 875,703, filed Feb. 6, 1978 by A. H. Kumar et al. (whose teachings are incorporated herein by reference thereto), which eliminates disadvantages of alumina ceramic structures. The disclosed multilayer glass-ceramic structures are characterized with low dielectric constants and are compatible with thick film circuitry of gold, silver or copper, and are co-firable therewith.

Of the two types of glass-ceramics disclosed in the aforesaid application Ser. No. 875,703, one has a $\beta$-spodumene, $Li_2O.Al_2O_3.4SiO_2$, as the principal crystalline phase while the other has cordierite, $2MgO.2Al_2O_3.5SiO_2$, as the main crystalline phase. A common feature of these sintered glass-ceramics, among others, is their excellent sinterability and crystallization below 1000° C.

However, it was found that silver has a tendency to cause electro-migration problems and is suspected of diffusing into the glass-ceramic.

Although successful glass-ceramic substrates have been made using gold metallurgy (resistivity of about 3.75 microhm-centimeter), gold is, however, extremely expensive, which does limit the choice to copper as a practical economic alternative. Also, any alloying in this regard would result in the disadvantage of an increase in resistivity.

The use of copper is relatively new in the thick film technology. Because of copper's oxidizing potential, it is necessary to sinter multilayer structures in reducing or neutral ambients. However, since reducing ambients can occasion adhesion problems, neutral ambients are preferable. A typical industrial cycle to sinter thick copper films on pre-fired alumina substrate would be at a rate of 50°–70° C./min. to a firing or sintering range of 900°–950° C. with a 15 minute hold at the peak temperature followed by cooling at a rate of 50°–70° C./min.

In the fabrication of multilevel glass-ceramic structures; difficulties can be encountered in the use of the binders which can preclude use of those found optional in conventional processing. For example, the polyvinylbutyral binder has been found as not being easily burnt-out completely in a non-oxidizing ambient below 1150° C. Also, a requirement for binder removal is that the glass-ceramic body remain porous until all residues have been removed.

With the use of glass-ceramics and copper metallurgy, the maximum temperature for binder removal is much lower due to the coalescence of the glass particulate at about 800° C.–875° C. Thus, after the glass has coalesced, any remaining binder residue will become entrapped in the glassy body. It has also been found that nitrogen or any other neutral or reducing ambient make difficult the removal of binder below the temperature of glass coalescence, e.g. about 800° C.–875° C., which can result in black or darkened substrates that are not fully sintered. The black or darkened color is generally attributed as resulting from carbon residue.

Some difficulties were encountered with various neutral or reducing atmospheres, which included wet and dry nitrogen, wet and dry forming gas, long holds at temperatures below the coalescences of the glass-ceramic (so not to entrap volatile products) and alternating air and forming gas, for purposes of oxidizing carbon and reducing any formed copper-oxide to copper, without drastic volume changes resulting from the copper-oxide formation.

Attempts to develop a polymer binder system which would, by some mechanism of fractionation (e.g. unzipping, hydrolysis, etc.), burn-off without any remaining carbonaceous residue, which would not darken the substrates, resulted in other attendance disadvantages, even though characterized with good burn-out properties. For example, polyalphamethystryene and polyisobutylene were found to be poor film formers (e.g. form poor green sheets). Polyoxymethelene, polyethylene and polypropylene were found to extrude since they do not adequately solvate in conventionally preferred solvents, and did not have adequate burn-off characteristics.

BRIEF DESCRIPTION OF THE DRAWINGS

FIG. 1 is a graph illustrating the equilibrium between copper, carbon and their oxides in a $H_2/H_2O$ ambient.

FIG. 2 is a graph illustrating the binder removal and bloating of a glass-ceramic green sheet in a $H_2/H_2O$ environment.

DISCLOSURE OF INVENTION

It was discovered, in accordance with this invention that an ambient mixture of hydrogen ($H_2$) and water vapor ($H_2O$) in specific defined ratios can be used to oxidize carbon containing residues of fired polymers while maintaining reducing to neutral conditions for copper. Accordingly, a process has been developed to remove polymeric binders (ex. polyvinylbutyral) from glass-ceramic/copper multilayer substrates based on this concept. The process involves heating a laminated assembly of green glass-ceramic layers, with an internal copper forming pattern in a $H_2/H_2O$ ambient at a rate of 1° to 3° C. per minute to a burn-out temperature of 785±10° C., holding for 3–5 hours to burn out the polymeric material, followed by changing the ambient to nitrogen, $N_2$, with about a 0.5 hour hold to remove entrapped or dissolved water, with subsequent heating in nitrogen at a rate of 1°–3° C./min. to a sintering temperature of about 930° to about 970° C. with a 2 hour hold at this temperature. During the heating to the burn-out temperature, in one embodiment, the $H_2/H_2O$ ratios of the ambient are changed continuously from $10^{-6}$ at 400° C. to $10^{-4}$ at the burn-out temperature. The change in the $H_2/H_2O$ ratio, in general, is one that will maintain an ambient slightly reducing to copper but highly oxidizing to carbon at all times. This firing cycle, for the multilayer glass-ceramic structure, has been found to completely remove the binders while keeping copper reduced, to result in white substrates with good metallic copper. FIG. 1 illustrates the equilibrium between copper, carbon and their oxides indicating that a mixture of $H_2$ and water vapor ($H_2O$) in the correct ratios can be used to oxidize carbon while maintaining reducing to neutral conditions for copper.

The reason for selecting the binder-removal or burn-out temperature of 785±10° C. is two-fold. As indicated previously, the crystallizable glass used must be porous at the binder-removal or burn-out hold temperatures to allow complete removal of the binders. Porosity, at this temperature, also allows easy removal of any entrapped or dissolved water in the glass near the end of the hold period.

Figure 3:
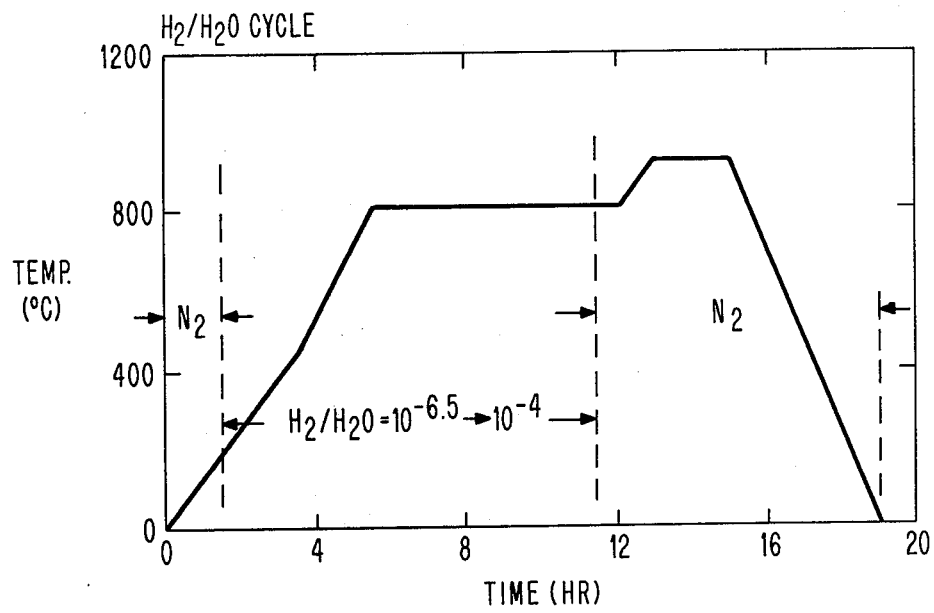
FIG. 3 is a curve showing a firing schedule in accordance with one embodiment of this invention.

A binder removal time-temperature window has been determined from considerations of carbon oxidation and the viscous flow characteristics of the crystallizable glass formulation No. 12 of the said copending application Ser. No. 875,703, is shown in FIG. 2. From the graph, it can be seen that too low a temperature (e.g. 750° C.) would take prohibitively excessive amounts of time for carbon removal, whereas too high a hold temperature (e.g. 830° C.) will trap water and binder residue when the glass pores close. As the dissolved water is being rejected during glass-crystal growth, (after pore closure), it will subsequently oxidize retained carbon to form carbon oxides and hydrogen causing the substrate to expand or, in the worst case, burst. This phenomena of bloating, when the glass-ceramic body expands instead of contracting on sintering, can be avoided by processing in accordance with this invention as illustrated by a typical firing schedule as shown in FIG. 3. As may be noted in FIG. 3, the laminated green glass-ceramic structure can be prewarmed in an inert atmosphere (e.g. $N_2$) to about 200° C., prior to switching to a $H_2/H_2O$ ambient.

Figure 4:
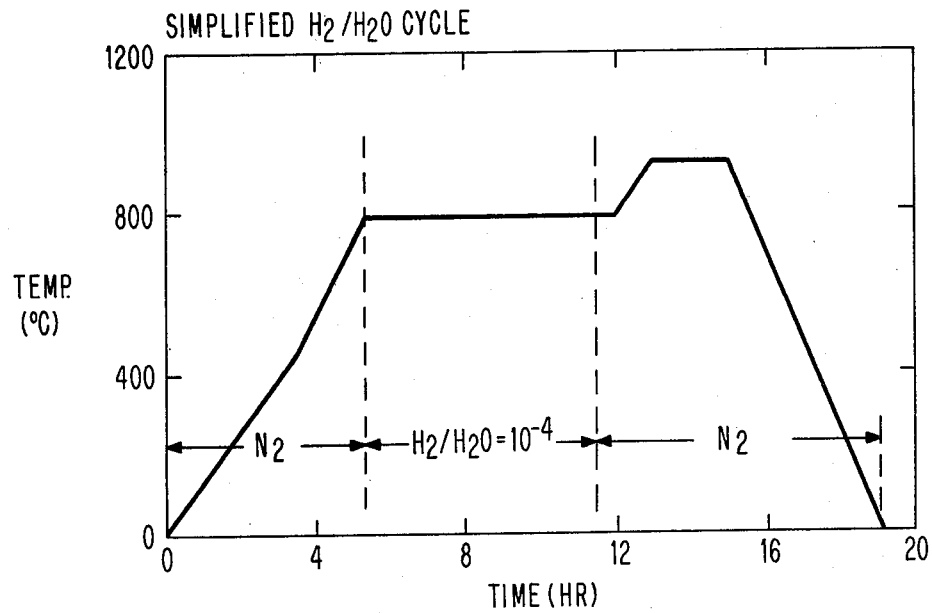
FIG. 4 is a curve showing a firing schedule in accordance with another embodiment of this invention.

FIG. 4 illustrates a typical modified firing schedule of a green glass-ceramic laminate to simplify the monitoring and continued changing of the $H_2/H_2O$ ratios to maintain the required process conditions in a production mode. Thermogravimetric (e.g. for polyvinylbutyral binders) and hot stage studies have indicated that, in nitrogen, most of the binder degradation and/or removal occurs by about 700° to 800° C. The advantage of such degradation is that the substrates can be fired in nitrogen to a temperature just below the coalescence (Tc) of the crystallizable glass, followed by switching to a $H_2/H_2O$ ambient to remove the remaining binder. This requires that only one specific ratio (e.g. $10^{-4}$) of the $H_2/H_2O$ be used at a firing temperature of $785 \pm 10°$ C., thus simplifying the process by reducing both the ambient control required and production costs.

It would normally be expected that the properties of glass-ceramic, such as strength (modules of rupture, TCE temperature coefficient of expansion) and dielectric constant (K) could be adversely affected by the $H_2/H_2O$ ambient. However, by following the firing schedules, defined in this invention, any dissolved water, in the glass-ceramic, is removed at the end of the hold period (e.g. at $785 \pm 10°$ C.). As a result, the properties of the $H_2/H_2O$ fired glass-ceramic do not degrade from that of air fired glass-ceramics as illustrated below for the firing in accordance with this invention of the noted crystallizable glass formulation #12:

Composition (by weight percent) of Glass Formulation #12:

| $SiO_2$ | 52.5 | $P_2O_5$ | 1.5 |
|---|---|---|---|
| MgO | 22.0 | $B_2O_3$ | 0.5 |
| $Al_2O_3$ | 22.0 | $ZrO_2$ | 1.5 |

After firing, in accordance with invention,
Modulus of Rupture = 210MN/m² (meganewton per meter squared, 1MN/m² = 143 psi)
TCE (Thermal coefficient or expansion) = $18 \times 10^{-7}/°$ C.
K Dielectric Constant = 5.0 (at 1000 Hz)

Commercially fired copper pastes (e.g. Electro-Science Lab. #2310 which is a fritted pasted, and Electro-Science Lab. #2311 which is a reactively bonded paste) have resistivities of 2.25 to 4 microhm-cm. This copper is normally fired in a relatively oxygen free ambient (30 ppm), although it may be noted that oxygen concentrations in excess of 10 ppb are oxidizing to copper at the temperatures of interest. The resistivities were measured on a line 230 micrometers wide and 23,000 micrometers long with an average thickness of 5.25 micrometers. The resistivity obtained after firing in the $H_2/H_2O$ ambient, was measured at $2.0 \pm 0.2$ microhm-cm.

Adhesion measurements were made by the so-called "pull test". In this test contact pins were soldered with 62Pb/36Sn/2Ag at about 180° C., for a few seconds, to pads of the copper metallurgy (e.g. Electro-Science Lab paste #2310) on a substrate (formed from the noted-formulation #12) that had been fired in accordance with this invention. The pins had a 760 micrometer (30mil) diameter head, and the pads were 1,520 micrometers (60 mil) in diameter. Pull rates of 560 micrometers (0.1 inches) per minute did not cause any significant deviations in the pull force value. One set of measurements gave 4.4 Kg (9.75 lbs.) average and another set of measurements gave 5.16 Kg (11.35 lbs.) force values. Most of the failures were at the copper-pin interface; and in some instances the glass-ceramic failed under the copper pad, and lifted out.

The above process described is amenable to a wide variety of glass-ceramic/copper substrates wherein the temperature of crystallization of the glass is about 100° to 150° C. below the melting point of copper. Illustrative of such glasses are the formulations disclosed in said copending application Ser. No. 875,703 as for example, the following compositions, by weight percent:

| Glass #11 | | | |
|---|---|---|---|
| $SiO_2$ | 52.5 | $P_2O_5$ | 2.0 |
| MgO | 22.0 | $B_2O_3$ | 1.0 |
| $Al_2O_3$ | 22.0 | $ZrO_2$ | 2.0 |
| Glass #12 | | | |
| $SiO_2$ | 52.5 | $P_2O_5$ | 1.5 |
| MgO | 22.0 | $ZrO_2$ | 1.5 |
| $Al_2O_3$ | 22.0 | $B_2O_3$ | 0.5 |
| Glass #14 | | | |
| $SiO_2$ | 52.5 | $P_2O_5$ | 2.0 |
| MgO | 22.0 | $B_2O_3$ | 1.0 |
| $Al_2O_3$ | 22.0 | ZnO | 1.0 |
| Glass #16 | | | |
| $SiO_2$ | 52.5 | $B_2O_3$ | 1.0 |
| MgO | 23.5 | $SnO_2$ | 2.0 |
| $Al_2O_3$ | 21.0 | | | each of which has a binder burn-out temperature of $785° \pm 10°$ C., and

| Glass #10 | | | |
|---|---|---|---|
| $SiO_2$ | 50.6 | $P_2O_5$ | 2.0 |
| MgO | 24.2 | $B_2O_3$ | 2.0 |
| $Al_2O_3$ | 21.2 | | | which can be heated to $720° \pm 10°$ C., for binder burn-out, due to its lower temperature of coalescence.

BEST MODE FOR CARRYING OUT THE INVENTION

The multilayered substrate fabrication process involves the following illustrative basic steps:

Step 1

The cullet of the chosen crystallizable glass (specifically Glass #12 for this example) is ground to average particle sizes in the range of 2 to 7 micrometers. The grinding can be done in two stages, a preliminary dry or wet grinding to 400 mesh particle size followed by further grinding with suitable organic binders and solvents until the average particle size is reduced to lie between 2 to 7 micrometers and a castable slurry or slip is obtained. A single stage prolonged grinding of cullet in the medium of the binder and solvent, until the desired particle sizes are obtained can also be used. In the latter case, a filtering step may be necessary to remove oversized particles.

By way of example, a suitable binder is polyvinylbutyral resin with a plasticizer such as dipropylglycoldibenzoate (e.g. the commercial Benzoflex plasticizer of the Tennessee Products and Chemical Corp.). Other suitable polymers are polyvinyl formal, polyvinyl chloride, polyvinyl acetate, selected ones of the acrylic resins, and the like. Similarly other suitable plasticizers such as dioctylphthalate, dibutyl phthalate, and the like, can also be used.

The purpose of adding an easily evaporable solvent is (1) to initially dissolve the binder so as to enable it to coat the individual glass particles, and (2) to adjust the rheology of the slip or slurry for good castability. A particularly effective solvent for the purpose of this example are the dual solvent systems of the said U.S. Pat. No. 4,104,345, specifically the dual methanol/-methyl isobutylketone (in a ⅜ weight ratio) solvent system.

Step 2

The slip or slurry prepared as in Step 1 is cast, in accordance with conventional techniques, into this green sheets (e.g. about 200-250 micrometers (8-10 mils) thick), preferably by doctor-blading techniques.

Step 3

The cast sheets are blanked to the required dimensions and via holes are punched through them in the required configuration.

Step 4

A metallizing paste of copper (e.g. Electro-Science Lab #2310 for this example) is extruded into the via holes in the individual sheets.

Step 5

A suitable copper paste or ink (e.g. Electro-Science Lab #2310) is then screen-printed onto the individual green sheets of Step 4, in the required conductor patterns.

Step 6

A plurality of sheets, prepared as in Step 5, are laminated together in registry in a laminating press;

The temperature and pressure employed for lamination should be such as to cause (1) the individual green sheets to bond to each other to yield a monolithic green substrate, and (2) to cause the green ceramic to sufficiently flow and enclose the conductor patterns.

Step 7

Firing of the laminate to the sintering temperatures to accomplish binder removal, sintering or coalescence of the glass particles, and conversions to a glass-ceramic by crystallization with concurrent sintering of the metal particles, in the conductor patterns, the dense copper lines and vias.

A typical firing schedule is shown in FIG. 3. For this example, the green-laminate is preheated at a rate of 2.15° C./min. in a nitrogen ambient for about 1½ hours to a temperature of about 200° C. At this point the nitrogen is replaced with a $H_2/H_2O$ ambient in a volume ratio $10^{-6.5}$. The heating is continued to about 450° C. at which point the rate of heating is increased to about 2.9° C./min., and the heating continued to a hold temperature of about 780° C. (e.g. about 2 hours). After about 6 hours at the 780° C. hold temperature, the $H_2/H_2O$ ambient is switched to a nitrogen ambient, and the 780° C. hold temperature maintained for an additional ½ hour, at which point the heating is again elevated at a rate of 2.1° C./min. to the crystallization temperature of the glass, (e.g. about 960° C. for the Glass #12), which temperature is held for about 2 hours, after which the temperature is reduced to ambient at a rate of about 3.8° C./min.

During the 9½ hour duration of the $H_2/H_2O$ ambient, its volume ratio is continually changed (increased) from $10^{-6.5}$ to $10^{-4}$.

FIG. 4 illustrates a simplified processing scheme where the firing schedule is substantially the same with the exceptions that (1) the initial nitrogen ambient is maintained until the burn-out temperature (e.g. about 780° C.) is reached at which point the ambient is switched to $H_2/H_2O$ at a volume ratio of $10^{-4}$ which (2) is maintained substantially constant over the binder burn-out period (e.g. about 6 hours) before switching back to a nitrogen ambient and continuing heating at the hold temperature (780° C.) an additional ½ hour for $H_2O$ drive-out, and subsequent heating to a hold period at the crystallization temperature of the glass.

While the invention has been illustrated and described with respect to preferred embodiments, it is to be understood that the invention is limited to the precise constructions herein disclosed, and the right is reserved to all changes and modifications coming within the scope of the invention as defined in the appended claims.

Having thus described the invention, what is claimed as new and desired to be secured by Letters Patent is:

1. A method of forming a glass-ceramic composite structure with copper based metallurgy comprising:

forming at least one green sheet comprised of a thermoplastic organic binder having dispersed therein particles of a crystallizable glass having a crystallization temperature below the melting point of copper;

forming on a surface of a first said green sheet a pattern of a nonrefractory copper based conductor forming composition wherein the predominant component of said conductor is copper;

superimposing a second said sheet on said surface of said first sheet to sandwich said pattern therebetween;

laminating said superimposed sheets together;

heating said laminate in an ambient of hydrogen and $H_2O$ in a ratio of $H_2/H_2O=$ about $10^{-4}$ to about $10^{-6.5}$ to a burn-out temperature in the range between the anneal and softening points of said glass and maintained thereat for sufficient time to decompose and eliminate said binder, substituting an inert atmosphere for said ambient; and heating said laminate to the crystallization temperature of said glass for coalescence of said glass particles and crystallization thereof into a glass-ceramic structure have a copper-based conductor pattern extending within the interior thereof.

2. The method of claim 1 wherein said glass particles have the composition, by weight percent,

| MgO | 22 to 24.2 | $Al_2O_3$ | 21 to 22 |
| $SiO_2$ | 50.6 to 52.5 | $P_2O_5$ | 0 to 2 |
| $B_2O_3$ | 0.5 to 2 | $ZrO_2$ | 0 to 2 |
| $SnO_2$ | 0 to 2 | | |

3. The method of claim 1 including providing means for extending said pattern to at least one surface of said fired laminate.

4. The method of claim 3 including mounting an integrated semiconductor chip on said surface in electrical connection to a portion of said pattern extension.

5. The method of claim 1 wherein said glass is selected from the group of β-spdoumene or cordierite glasses.

6. The method of claim 5 wherein said laminate is heated in said ambient to a burn-out temperature in the range of about 720°±10° to about 785°±10° C.

7. The method of claim 6 wherein said laminate is heated to said burn-out temperature at a rate of about 1° to 3° C. per minute.

8. The method of claim 6 wherein the $H_2/H_2O$ ratio of said ambient is continuously changed from about $10^{-6.5}$ to about $10^{-4}$ over the course of said heating in said ambient.

9. The method of claim 8 wherein said laminate is preheated in an inert atmosphere to a temperature of about 100° C. prior to heating in said ambient.

10. The method of claim 6 wherein the $H_2/H_2O$ ratio of said ambient is about $10^{-4}$ over the course of said heating in said ambient.

11. The method of claim 10 wherein said laminate is preheated in an inert atmosphere to said burn-out temperature prior maintainance thereat in said ambient for burn-out of said binder.

12. The method of claim 5 wherein said crystallization temperature is in the range of about 920° to about 970° C.

13. The method of claim 12 wherein said laminate is heated to said crystallization temperature at a rate of about 1° to 3° C. per minute.

14. The method of claim 1 wherein said glass-ceramic selected from the group having $Li_2O.Al_2O_3.4SiO_2$ β-spdoumene or $2MgO.2Al_2O_3.5SiO_2$ alphacordierite crystalline phases.

15. The methods of claims 1, 2, 3, 4, 5, 6, 7, 8, 9, 10, 11, 12, 13 or 14 wherein said conductor is a copper alloy.

16. The method of claims 1, 2, 3, 4, 5, 6, 7, 8, 9, 10, 11, 12, 13 or 14 wherein said conductor is substantially copper.

* * * * *